United States Patent [19]

Gooch

[11] 3,965,568

[45] June 29, 1976

[54] PROCESS FOR FABRICATION AND ASSEMBLY OF SEMICONDUCTOR DEVICES

[75] Inventor: Roland W. Gooch, Dallas, Tex.

[73] Assignee: Texas Instruments Incorporated, Dallas, Tex.

[22] Filed: June 5, 1975

[21] Appl. No.: 583,927

Related U.S. Application Data

[63] Continuation of Ser. No. 392,148, Aug. 27, 1973, abandoned.

[52] U.S. Cl. .................................. 29/583; 29/580; 29/591; 29/610 R
[51] Int. Cl.² ........................................ B01J 17/00
[58] Field of Search ............ 29/580, 583, 591, 588, 29/589, 590, 610, 620, 621

[56] References Cited
UNITED STATES PATENTS

| 3,290,753 | 12/1966 | Chang | 29/580 |
|---|---|---|---|
| 3,691,628 | 9/1972 | Kim | 29/577 |
| 3,750,270 | 8/1973 | Ishii | 29/580 |

Primary Examiner—W. Tupman
Attorney, Agent, or Firm—Harold Levine; Rene' E. Grossman; Alva H. Bandy

[57] ABSTRACT

A method of mounting a semiconductor device and making electrical connections without the use of bond wires is disclosed. In preferred form this process also includes fabrication of an IR detector array. Mesas in the mirror image of a desired array pattern are formed on the surface of a bar of IR sensitive material by etching to a depth greater than the desired final detector array thickness. A lead pattern for the desired detector array is formed on a support member with contact pads plated to a thickness greater than the final detector thickness. The bar of detector material is turned over and the etched surface bonded to the support member by means of an adhesive which also fills the area between the lead pattern contact pads and contact areas of the detector, to form a semiconductor unit. The semiconductor unit is lapped to final detector thickness to form a coplanar surface of the lead pattern contact pads, detector contact areas, and the adhesive material. An interconnect pattern is then formed on this coplanar surface to connect the detector array to the support member lead pattern to complete the semiconductor device.

11 Claims, 5 Drawing Figures

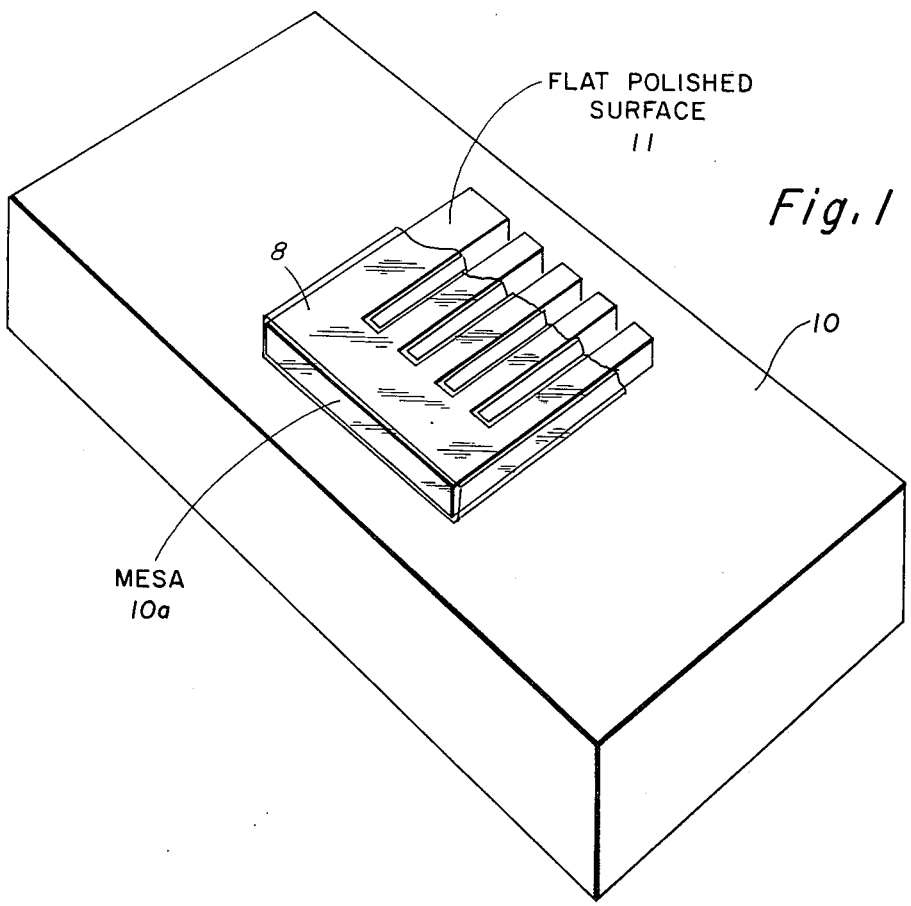
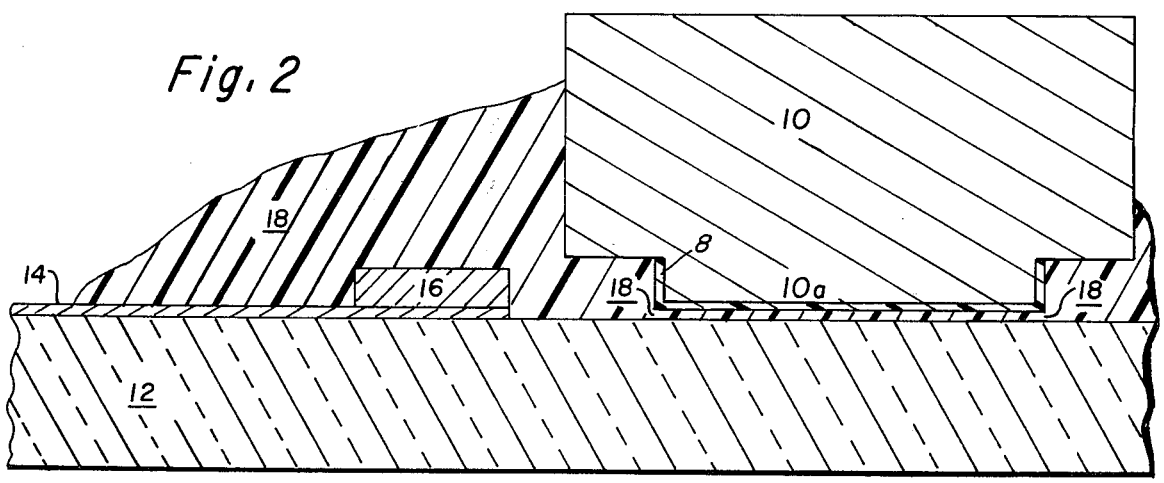

PROCESS FOR FABRICATION AND ASSEMBLY OF SEMICONDUCTOR DEVICES

This is a continuation, division, of application Ser. No. 392,148, filed Aug. 27, 1973, now abandoned. This invention relates to a method of fabricating and assembling semiconductor devices.

Thermocompression wire bonds are commonly used to electrically connect semiconductor chips to the leads of the packages in which they are assembled. Wire bonds are individually formed by manual operation and often exhibit one of several modes of failure. These two factors increase the cost and decrease the reliability of semiconductor devices in direct proportion to the number of wire bond electrical connections required. An example of devices whose size has been limited by wire bonding process is the IR detector array. These arrays typically use bulk response photoconductive materials such as (Hg,Cd)Te (mercury cadmium telluride) which responds to IR radiation by exhibiting a change in resistivity. This type of material is to be distinguished from photodiodes which respond to radiation by generation of reverse current at a P-N junction.

A typical IR array fabrication process includes the steps of mounting a crystal of (Hg,Cd)Te on a support member, lapping it to a desired thickness, etching away all but the desired detector pattern and coating the semiconductor material with metal except in the actual detection areas. The detector elements are then connected to a lead pattern on the support member by means of thermocompression wire bonds. These arrays require one signal lead per element and at least one ground lead per array and possibly one ground lead per element. Thus it is seen that large arrays can require hundreds of wire bonds and can be fabricated only with high cost and low yield.

Accordingly, it is an object of the present invention to provide a semiconductor device fabrication technique which eliminates the use of wire interconnects.

Another object of this invention is to provide a semiconductor device assembly process compatible with mass production techniques.

Another object of this invention is to provide an IR detector array fabrication and assembly process which will increase the practical limit on the number of elements in an array.

Another object of this invention is to provide a process for assembling semiconductor devices which will require less space and have improved mechanical strength.

Briefly stated this invention comprises the steps of forming a coplanar surface of the semiconductor device contact areas, an insulating adhesive, and support member lead pattern contact areas and then forming an interconnect pattern on this surface by a suitable deposition process. All the connections are formed in a single step and the disadvantages of thermocompression wire bonds are avoided. Devices produced by this process require less space and are more rugged than devices using wire bonded leads. The devices also have better thermal contact with the support member and better mechanical strength than beam leaded or flip chip type devices.

Other objects, features and advantages of the invention will be more readily understood from the following detailed description when read in conjunction with the attached drawings wherein:

FIG. 1 is a sketch of the flat polished surface of a bar of detector material after the detector pattern has been etched into the surface;

FIG. 2 is a sectional view of the assembly after the detector bar is attached to the support member;

Figure 3:
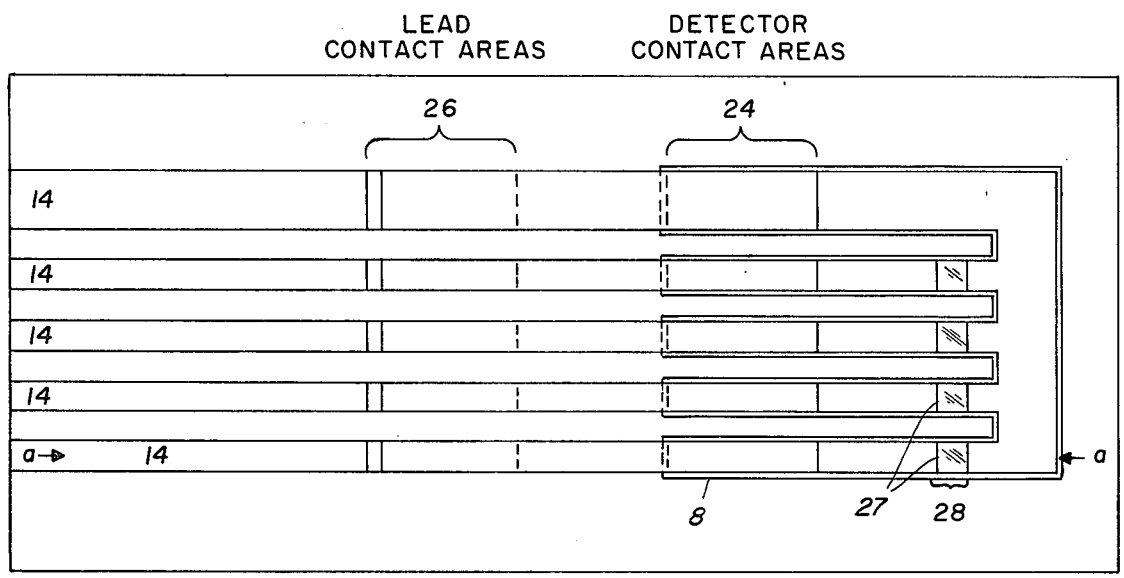
FIG. 3 is a sketch of the top surface of a four element detector array.

The preferred embodiment will be described in terms of fabrication of an IR detector array from bulk response photoconducting material. This is not intended to limit the process to either bulk response materials or detector arrays.

Referring to the drawings, FIG. 1 shows the results of the etching step which is applied to a flat polished surface 11 of the bar of detector material 10. The etching step is well known in the art. The surface to be etched is first coated with a photoresist material. This photoresist is then exposed to light through a photomask which defines the mirror image of a desired detector pattern. The photoresist is then developed to expose the areas which are to be etched away. A suitable etchant, such as bromine dissolved in alcohol, for (Hg,Cd)Te, is used to remove material to a depth greater than the desired final detector thickness. After etching the photoresist is removed from the remaining mesa.

This etching step may be performed as a later step; that is after the bar of material is bonded to the support member and lapped, as is typically done in the prior art. Etching prior to bonding, however, is preferred for several reasons. Where passivation of the material is required, the etched surface may conveniently be anodized with the result that three of the four detector surfaces are passivated prior to bonding to the support member. The etched surface also allows the bonding adhesive to contact the sides as well as the bottom of the detector elements providing better mechanical support and thermal contact.

Referring to FIGS. 2 and 3, a lead pattern 14 is formed on a suitable support member 12, such as synthetic sapphire, in a shape corresponding to the detector contact areas 24. This lead pattern may be formed by thin film evaporation and etching techniques which are well known in the art. A conductive material 16, such as gold, is then plated on the contact areas 26 of this metallization pattern to which leads from the detector contact areas 24 will be attached. The material 16 is plated to a thickness greater than the desired final detector material thickness.

The surface 11 of the bar of detector material 10 with the etched detector pattern 10a is next bonded to the support member with a suitable adhesive 18, such as an epoxy resin. The adhesive material is applied to the entire detector pattern and to the support member in the lead pattern contact areas 26 and fills the area between the lead pattern contact areas 26 and the detector contact areas 24 which are aligned adjacent to each other. Where transparent support material, such as sapphire, is used alignment is made by viewing the detector bar 10 through the support 12 as the two parts are placed in contact. Other alignment techniques would be suitable if an opaque support material such as polycrystalline alumina were used. The adhesive is then allowed to cure or harden.

Figure 4:
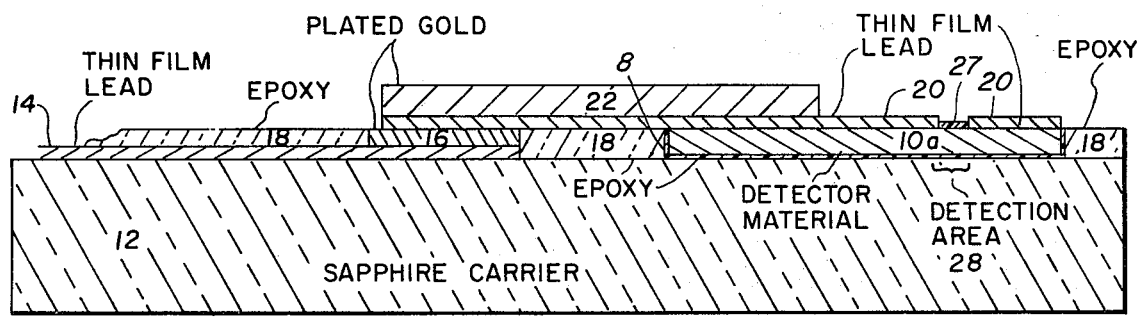
FIG. 4 is a sectional view taken along lines a—a in FIG. 3.

Referring to FIG. 4, the assembly of the detector bar and support member is lapped and polished removing the bulk of the detector material and leaving a portion of the mesa 10a with an optimum detector thickness. A portion of the plating 16 on the lead pattern contact areas 26 and the adhesive material 18 are also removed by the lapping step and form a flat surface coplanar with the surface of the detector pattern 10a.

At this point in the process the detector array has been formed but is still electrically isolated from the support member lead pattern and the entire upper surface of the material is exposed to incident radiation. An interconnect pattern 20 is formed on the coplanar surface to make the electrical connections from the array to the support member leads and to also mask the detector material leaving only the desired detection area 28 exposed. The interconnect pattern is formed by a suitable process such as vacuum deposition of indium. A low temperature deposition process is required because the (Hg, Cd)Te material and most epoxy resins would be damaged by higher temperature deposition processes.

Passivation of the detection areas may be performed before or in conjunction with the deposition of the interconnect pattern if required. The passivation is typically by anodization which requires electrical connection to the material to be anodized. The connection is made through the support member lead pattern. The interconnect pattern 20 is applied only to the lead contact areas 26, the adhesive surface and the detector contact areas 24. The entire coplanar surface, except for the detection area 28, is then masked with a photoresist material. This insures that none of the interconnect metallization 20 is exposed to the anodization solution. The detection areas 28 are then anodized and the photoresist material is removed. The rest of the interconnect pattern is deposited over the detector material. By simply depositing the entire interconnect pattern over the portion applied for the passivation step a double thickness may be formed over the adhesive region.

The conductivity and mechanical strength of the interconnect crossing the adhesive material may be improved by plating conductive material 22, such as gold, on the portion of the interconnect pattern from the support member lead pattern contact areas 26 across the adhesive to the detector contact areas 24.

Since all the connections from the detectors to the support member lead pattern 14 are formed simultaneously, the fabrication cost does not increase and the yield does not decrease in direct proportion to the number of elements. Thus arrays with many more elements than was practical in the prior art may be fabricated by this process without increasing the cost or lowering the yield.

Figure 5:
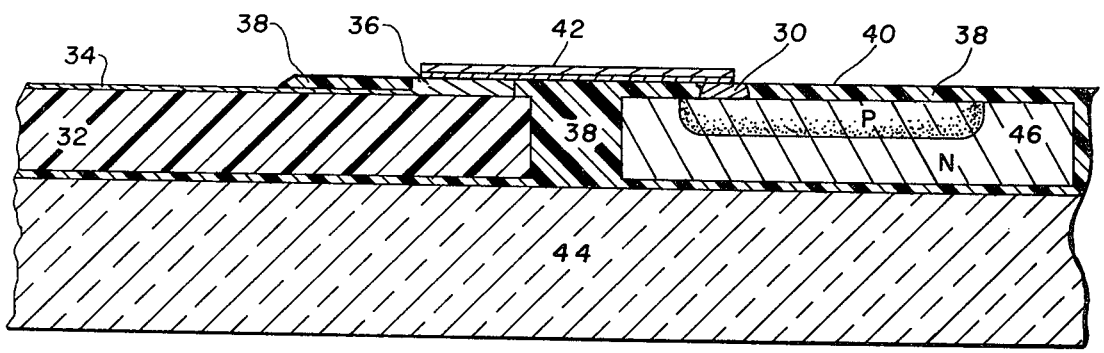
FIG. 5 is a sectional view of another embodiment of the present invention.

The process of the present invention can be used to fabricate detectors, radiation emitting devices, and other semiconductor devices which contain P-N junctions. In such an application, as illustrated in FIG. 5, an additional step is required to insure that the lapping step does not remove semiconductor material from the surface to which the active regions extend. This step is to plate conducting material 30, such as gold, on the semiconductor device 46 contact areas to form bump contacts similar to those used in flip chip devices. The lapping step then removes material from the bump contacts without damaging the active semiconductor regions.

The top surface of the support member lead pattern contact area plating must be at substantially the same height above the support member as the top surface of the semiconductor device bump contacts. If this plating is too thin, the lapping step will remove the bump contacts and semiconductor material and destroy the device before removing part of the support member lead pattern contact area. The lead pattern contact area plating thickness may be increased to match the thickness of the semiconductor device plus its bump contacts. Since most semiconductor device substrates are many times thicker than the optimum detector thickness in the preferred embodiment some other suitable method of raising the support member lead pattern contact areas may be used. One such method makes use of a flexible printed circuit board material 32, such as Kapton. The lead pattern 34 is formed on flexible material having a thickness equal to the semiconductor substrate thickness. This lead pattern ends at one edge of the flexible material and the contact areas are plated with conductive material 36 to a thickness corresponding to the plating 30 forming the semiconductor device bump contacts. This flexible material 32 is then bonded to the support 44 adjacent to and in alignment with the semiconductor device 46. The bond is formed by a suitable adhesive such as an epoxy resin which fills the space between the edges of the flexible material and the semiconductor device. The lapping step removes plated material from the lead pattern and semiconductor bump contacts and adhesive material 38 forming a coplanar surface 40. The interconnections 42 from active devices to lead patterns are formed by depositing conductive material on this coplanar surface, as described in the first embodiment.

The use of the flexible printed circuit board material has other advantages also. The material can be formed into a cable to connect the support member lead pattern to other parts of the system. This eliminates a set of connections from the support member to a cable.

Where the semiconductor substrate contains an array of elements, they may be electrically isolated from each other after the substrate is bonded to the support member. This is done by masking the substrate to protect the desired active areas. Then the semiconductor material between active devices is etched away to expose the support member. This step provides better isolation between active devices than junction type isolation regions do. It also maintains the original spacing and orientation of the elements as diffused thereby avoiding difficult manual alignment of individual elements.

Although the present invention has been shown and illustrated in terms of a specific process, it will be apparent that changes or modifications can be made without departing from the spirit and scope of the invention as defined by the appended claims.

I claim:

1. A method for fabricating a semiconductor device consisting of:
    forming a lead pattern on a support member, said lead pattern having contacts of a thickness greater than a preselected thickness for forming a semiconductor device on said support member;
    bonding a semiconductor chip with an insulating adhesive to the support member in a spaced relationship to the contacts, said semiconductor chip having a thickness greater than said preselected thickness, and said adhesive also filling the space between the semiconductor chip and the contacts;

lapping the semiconductor chip, the adhesive, and the support member lead pattern contacts in a single removal operation to form a coplanar surface and to form a semiconductor device by reducing the thickness of said semiconductor chip to said preselected thickness; and forming conductive leads on said coplanar surface for connecting the semiconductor device to the support member lead pattern contacts.

2. A process according to claim 1 further comprising etching away the semiconductor material between components after the device is bonded to the support member to form a plurality of isolated components.

3. A process according to claim 1 including the step of plating the interconnect pattern formed on the coplanar surface of the adhesive material to improve mechanical strength and conductivity.

4. A method for producing an infrared detector device consisting of:
   forming a lead pattern on a support member, said lead pattern having contacts of a thickness greater than a preselected thickness for forming an infrared detector on said support member;
   bonding a bar of detector material with an insulating adhesive to the support member in a spaced relationship to the contacts, said bar having a thickness greater than said preselected thickness, and said adhesive also filling the space between the bar and the contacts;
   lapping the bar of detector material, the adhesive, and the support member lead pattern contacts in a single removal operation to form a coplanar surface and to form a detector by reducing the thickness of said bar of detector material to said preselected thickness; and
   forming conductive leads on said coplanar surface for connecting the detector to the support member lead pattern contacts.

5. A process according to claim 4 including the step of forming mesas in the mirror image of a desired detector pattern on a surface of the bar of detector material by etching the bar to a depth greater than said preselected thickness, prior to bonding the surface to the support member.

6. A process according to claim 4 including the step of etching the bonded and lapped bar of detector material to form a desired detector pattern.

7. A process according to claim 4 wherein the conductive leads on the lapped coplanar surface define detection areas and make electrical connection to the support member lead pattern contacts.

8. A process according to claim 4 further including plating the conductive leads formed on the coplanar surface of the adhesive material to improve mechanical strength and conductivity.

9. A process according to claim 4 including passivating a surface of the bar of detector material prior to bonding.

10. A process according to claim 9 wherein the passivation is formed by anodizing the surface.

11. A process according to claim 4 including the step of passivating a surface of a detection area of the infrared detector by:
   forming an interconnect pattern on the coplanar surface from the support member lead pattern contacts across the adhesive surface to the infrared detector masking the detector with a photoresist material except in the desired detection area, and anodizing the exposed surface of the detector.

* * * * *